United States Patent [19]

Anthony

[11] Patent Number: 4,724,016
[45] Date of Patent: Feb. 9, 1988

[54] ION-IMPLANTATION OF ZIRCONIUM AND ITS ALLOYS

[75] Inventor: Andrew J. Anthony, Tariffville, Conn.

[73] Assignee: Combustion Engineering, Inc., Windsor, Conn.

[21] Appl. No.: 777,645

[22] Filed: Sep. 19, 1985

[51] Int. Cl.⁴ .............................................. C22C 3/00
[52] U.S. Cl. .................................. 148/421; 148/900; 204/192.31
[58] Field of Search .................. 420/422; 204/192 N; 148/4, 13, 133, 20.3, 39, 421, 900

[56] References Cited

U.S. PATENT DOCUMENTS 3,150,972 9/1964 Rösler et al. .................... 420/422
3,205,076 9/1965 Bertea et al. .................... 420/422
3,664,825 5/1972 Bergqvist et al. ............... 420/422
3,674,571 7/1972 Thyne et al. .................... 420/422

FOREIGN PATENT DOCUMENTS 2125442 3/1984 United Kingdom ................. 148/4

Primary Examiner—L. Dewayne Rutledge
Assistant Examiner—S. Kastler
Attorney, Agent, or Firm—Michael J. Weins; Janine J. Weins

[57] ABSTRACT

The present invention is directed to a method for increasing the wear and corrosion resistance of zirconium and zirconium alloys by ion implantation. In particular the present invention is directed to the ion implantation of nitrogen and/or carbon for the purpose of increasing wear resistance; and the ion implantation of arsenic, carbon, chromium, nitrogen, tin, phosphorus or combinations thereof for the purpose of increasing the corrosion resistance.

5 Claims, 4 Drawing Figures

.01 cm

.01 cm

.01 cm

.01 cm

ION-IMPLANTATION OF ZIRCONIUM AND ITS ALLOYS

DESCRIPTION

1. Field of Invention

The present invention is directed to a method for increasing the wear and corrosion resistance of zirconium and zirconium alloys by ion implantation. In particular the present invention is directed to the ion implantation of nitrogen and/or carbon for the purpose of increasing wear resistance; and the ion implantation of arsenic, carbon, chromium, nitrogen, tin, phosphorus or combinations thereof for the purpose of increasing corrosion resistance.

2. Background

Zirconium alloys such as Zircaloy are frequently used in nuclear environments. Zircaloy in particular has a desirable combination of properties for use in nuclear environments including a relatively low neutron cross section, good corrosion resistance during early stages of operation and elevated temperature stability. The wear resistance of Zircaloy, however, may be less than desirable for certain applications and the corrosion resistance, although characterized as good, may be erratic. When impurity levels of zirconium alloys are not controlled the corrosion resistance can be erratic. Nitrogen and carbon are known to have a particularly adverse effect on the corrosion resistance. It is reported in the Metals Handbook, Volume 3, 9th edition, 1980, pages 784-791; and in Metallurgy of Zirconium, B. Lustman and F. Kerze Jr., 1955, McGraw-Hill, that nitrogen levels of greater than 40 ppm or carbon concentrations greater than about 300 ppm markedly decrease the corrosion resistance of zirconium alloys.

Ion implantation has been used extensively in semiconductor processing. More recently, metal and ceramic surfaces used in a variety of applications, including prosthetic devices used within the human body and tools, have been ion implanted to increase the wear resistance. The life of tool and die components used for drills, dies, injection molds, slitters, knives and mill rolls has been prolonged significantly by ion implantation of nitrogen. Nitrogen and carbon ion implantation of titanium, aluminum and vanadium alloys components has been shown to increase the wear resistance by a factor of 400 or more when compared to non-ion implanted components.

Thus while carbon and nitrogen have been found effective in increasing the wear resistance of some alloys, carbon and nitrogen are known to be detrimental to the properties of zirconium and its alloys.

U.S. Pat. No. 3,664,825 although teaching the addition of carbon to zirconium alloys, limits the addition to less than 300 ppm.

U.S. Pat. No. 3,674,571 teaches nitriding the surfaces of zirconium alloys, however, the '571 patent requires that the alloy to be nitrided have additions of at least 10% of metals selected from the group molybdenum and tungsten, and a minimum of 15% of a metal selected from the group; columbium, tantalum and vanadium to develop a continuous nitride surface. A continuous surface would be necessary, but not sufficient, to provide a corrosion barrier. Thus, there is a need for a method of increasing both the corrosion and the wear resistance of zirconium alloys such as Zircaloy.

SUMMARY OF INVENTION

It is an object of this invention to provide a method of increasing the wear resistance of zirconium alloys while maintaining their corrosion resistance.

It is another object of this invention to improve the consistency of the corrosion behavior of zirconium alloys.

Still another object of the invention is to enhance both the corrosion resistance and the wear resistance of zirconium alloys.

The present invention is directed to the ion implantation of zirconium and its alloys for the purpose of improving the wear and corrosion resistance.

In particular, the present invention is directed to the ion implantation of Zircaloy with arsenic, carbon, chromium, nitrogen, phosphorus, tin or combinations thereof. Nitrogen and carbon were found to be particularly effective in increasing the wear and corrosion resistance, while the other ions have been found to enhance the corrosion resistance.

The ion implantation of nitrogen has been shown to result in a factor of two improvement in the wear resistance of Zircaloy under a contact pressure of about 4,400 psi. Since the contact pressure for most applications in which Zircaloy is used is less than 500 psi, this data indicates that a wear reduction of ten or more would be expected from the ion implantation of nitrogen in Zircaloy. This improvement could provide Zircaloy components with sufficient wear resistance to permit Zircaloy to be used in applications where grid to grid wear, anti-bow grid wear, grid to core shroud wear and possibly fuel rod fretting wear would be encountered. The ion implantation of reactor guide tubes could eliminate the need for stainless steel sleeves to protect the guide tubes from control element assembly (CEA) wear.

For ion implantation of zirconium alloys it is preferred that the ion dosage be between about $10^7$ ions/cm$^2$ and $10^{18}$ ions/cm$^2$ and that the energy level of the ions be between about 5 keV and 200 keV.

BEST MODE OF CARRYING THE INVENTION INTO PRACTICE

Figure 1:
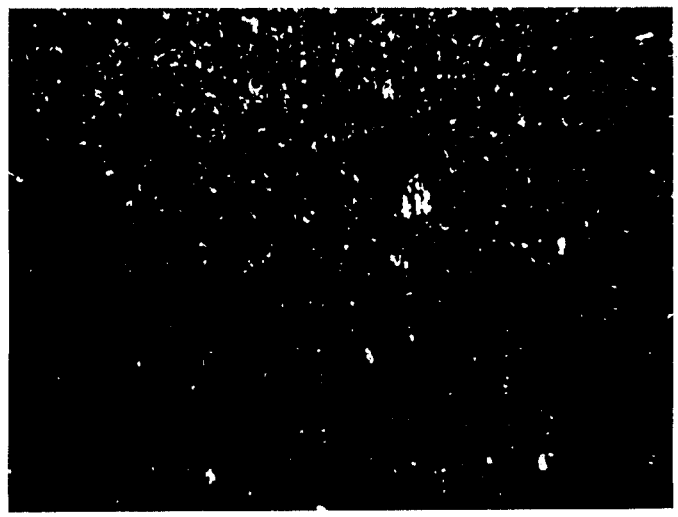
FIG. 1 shows a nitrogen implanted Zircaloy-4 plate which was wear tested with a Zircaloy-4 pin as discussed above. The plate shows no visible wear tracks.

The present invention is directed to the ion implantation of zirconium and its alloys for the purpose of improving the wear and corrosion resistance. In one preferred embodiment Zircaloy is ion implanted with nitrogen and/or carbon to improve the wear resistance.

In accordance with the present invention ion implantation of nitrogen has been shown to result in a factor of two improvement in the wear resistance of Zircaloy-4 when a contact pressure of about 4,400 psi is used. Since the contact pressure for most applications in which Zircaloy is used is less than 500 psi, a wear reduction factor of ten or more would be expected in most applications from the ion implantation of nitrogen in Zircaloy. This improvement in wear resistance could provide Zircaloy with sufficient wear resistance to be used in applications where grid to grid wear, anti-bow grid wear, grid to core shroud wear and possibly fuel rod fretting wear would be encountered. The ion implantation of reactor guide tubes could eliminate the need for stainless steel sleeves to protect the guide tubes from control element assembly (CEA) wear. Furthermore ion implantation of Zircaloy with nitrogen and carbon was found to enhance the corrosion resistance of the Zircaloy.

In order to establish the effect of ion implantation on corrosion resistance a series of Zircaloy-4 samples were ion implanted as set forth in Table I. Zircaloy-4 is a zirconium alloy which contains by weight about 1.5% tin, 0.15% iron, ad 0.1% chromium. After ion implantation the samples were exposed to steam at 750° F. (399° C.) and 1500 psi (10.3 MPa) for three days and then visually inspected in accordance with the test procedure set forth in ASTM designation G2-81, "Standard Practice of Aqueous Corrosion Testing of Samples of Zirconium and Zirconium Alloys".

The improvement in corrosion resistance of Zircaloy-4 resulting from the ion implantation of tin, phosphorus, carbon, chromium, arsenic, nitrogen, and carbon plus chromium is shown in Table I.

TABLE I

| Ion implanted | Visual inspection of Autoclave Corrosion |
| --- | --- |
| Tin - 2.5 × $10^7$ ion/cm$^2$ @ 80 keV | Black shiny Surface |
| Phosphorus - 2.0 × $10^7$ ion/cm$^2$ @ 150 keV | Black shiny Surface |
| Carbon - 2.0 × $10^7$ ion/cm$^2$ @ 120 keV | Black shiny Surface |
| Arsenic - 1.5 × $10^7$ ion/cm$^2$ @ 150 keV | Black shiny Surface |
| Nitrogen - 2.0 × $10^{17}$ ion/cm$^2$ @ 120 keV | Black shiny Surface |
| Chromium - 2.0 × $10^{17}$ ion/cm$^2$ @ 100 keV | Black shiny Surface |
| Carbon plus Chromium - 2.0 × $10^{17}$ ion/cm$^2$ @ 100 keV for Chromium 2.0 × $10^{17}$ ion/cm$^2$ @ 50 keV for Carbon | Black shiny Surface |

In all cases in which Zircaloy-4 was ion implanted before being exposed to steam, exposure to steam darkened the surface and caused a shiny black surface deposit to form. However, when Zircaloy-4 which had not been ion implanted was exposed to steam a grey surface resulted. The shiny black surface is indicative of a protective layer, or passive reaction product which retards subsequent corrosion. The formation of a protective layer results in a parabolic corrosive rate and should minimize erratic corrosion behavior.

The black shiny surfaces developed on all the ion implanted surfaces including the samples implanted with carbon and nitrogen; elements which the prior art teaches are detrimental to the corrosion resistance of zirconium alloys. Table I shows that the range of effective ion dosages varied many orders of magnitude and that dosages between about $10^7$ ions/cm$^2$ and $10^{18}$ ions/cm$^2$ were effective in promoting the corrosion resistance of Zircaloy-4.

In an effort to establish the wear resistance of ion implanted zirconium alloys, wear tests were conducted on Zircaloy-4 samples which had been ion implanted with nitrogen, chromium, and a combination of chromium and carbon. Prior to wear testing the implanted samples and a non-implanted set of samples were autoclaved in a simulated reactor environment to oxidize the surface to the finish that would be expected in the reactor. The ion-implanted samples showed marked resistance to oxide build-up during autoclaving. This was a further indication of the enhanced corrosion resistance resulting from ion implantation. After ion implantation and autoclaving the samples were wear tested on a pin to plate machine, similar to that described in WEAR, volume 77, [1982], pages 89-104, using Zircaloy-4 pins. All samples were tested under the same load conditions and wear cycle, this load and wear cycle was the load and wear cycle that had resulted in visual wear of the untreated Zircaloy sample. The wear tracks were photographed and the profiles measured using a profilometer. The ion implantation parameters for the samples which were wear tested are given in Table II.

TABLE II

| | IMPLANTATION PARAMETERS | | |
| --- | --- | --- | --- |
| SAMPLE | ION | DOSE | ENERGY |
| 1 | Nitrogen | 2.0 × $10^{17}$ ion/cm$^2$ | 120 keV |
| 2 | None | | |
| 3 (dual) | Chromium | 2.0 × $10^{17}$ ion/cm$^2$ | 100 keV |
| | Carbon | 2.0 × $10^{17}$ ion/cm$^2$ | 50 keV |
| 4 | Chromium | 2.0 × $10^{17}$ ion/cm$^2$ | 100 keV |

FIG. 1 shows a nitrogen implanted Zircaloy-4 plate which was wear tested with a Zircaloy-4 pin as discussed above. The plate shows no visible wear tracks.

Figure 2:
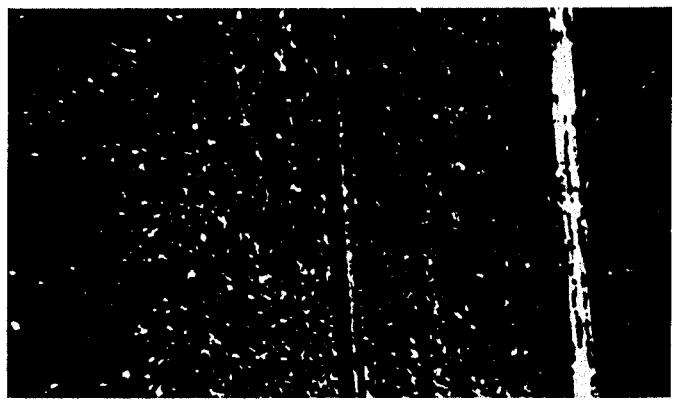
FIG. 2 shows a non-implanted Zircaloy-4 plate which was wear tested with a Zircaloy-4 pin as discussed above. The plate shows visible wear tracks.

FIG. 2 shows a non-implanted Zircaloy-4 plate which was wear tested with a Zircaloy-4 pin as discussed above. The plate shows visible wear tracks.

Figure 3:
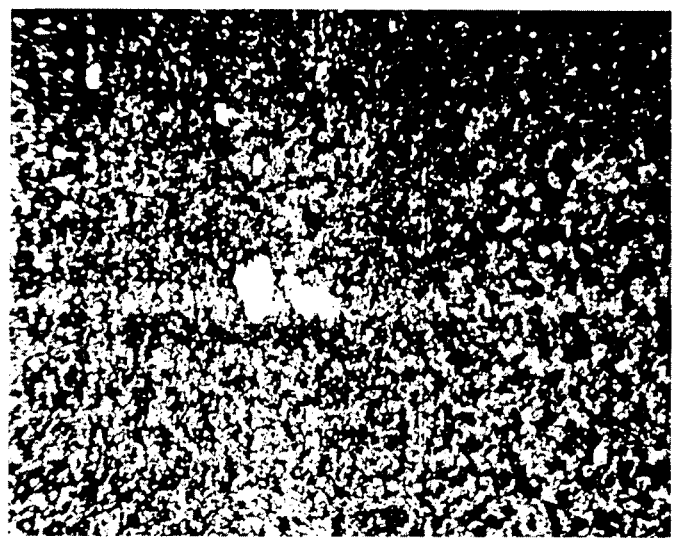
FIG. 3 shows a Zircaloy-4 plate which was implanted with a combination of chromium plus carbon and then wear tested with a Zircaloy-4 pin as discussed above. The plate shows no visible wear tracks.

FIG. 3 shows a Zircaloy-4 plate which was implanted with a combination of chromium plus carbon and then wear tested with a Zircaloy-4 pin as discussed above. The plate shows no visible wear tracks.

Figure 4:
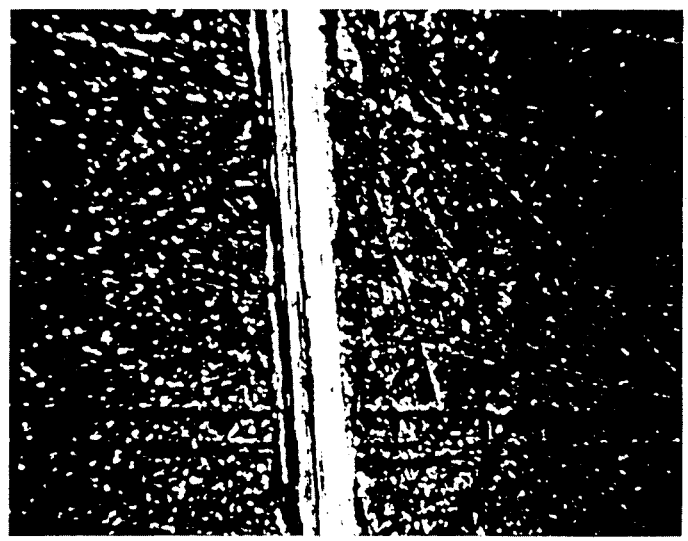
FIG. 4 shows a chromium implanted Zircaloy-4 plate which was wear tested with a Zircaloy-4 pin. The plate shows visible wear tracks.

FIG. 4 shows a chromium implanted Zircaloy-4 plate which was wear tested with a Zircaloy-4 pin. The plate shows visible wear tracks.

As can be seen from the results above the nitrogen, and chromium plus carbon implantation samples showed significantly improved wear resistance when compared to the non-implanted samples. Furthermore, these samples also exhibited an increase in hardness and a reduction in coefficient of friction. The increase in hardness and reduction in coefficient of friction were attributed to having caused the improvement in wear resistance.

While the novel features of this invention have been described in terms of preferred embodiments and particular applications, it will be appreciated that various omissions and substitutions in form and in detail of the present invention may be made by those skilled in the art without departing from the spirit of the invention.

What I claim is:

1. A method for improving the corrosion resistance of zirconium alloy components, said zirconium alloy having less than 15% by weight additions of metals from the group consisting of columbium, tantalum and vanadium, by ion implantation of the surface of such components with ions of one or more elements from the group consisting of carbon and nitrogen.

2. The method of claim 1 wherein said ions are limited to nitrogen.

3. The method of claim 1 wherein said ions are limited to carbon.

4. The method of claim 1 wherein the dosage of each of said ions is between $10^7$ ions/cm$^2$ and $10^{18}$ ions/cm$^2$.

5. The method of claim 4 wherein the energy level of said ions is between 5 keV and 200 keV.

* * * * *